(12) United States Patent
Stevens et al.

(10) Patent No.: US 6,794,219 B1
(45) Date of Patent: Sep. 21, 2004

(54) METHOD FOR CREATING A LATERAL OVERFLOW DRAIN, ANTI-BLOOMING STRUCTURE IN A CHARGE COUPLED DEVICE

(75) Inventors: Eric G. Stevens, Webster, NY (US); Hung Q. Doan, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 0 days.

(21) Appl. No.: 10/628,184

(22) Filed: Jul. 28, 2003

(51) Int. Cl.$^7$ .................. H01L 21/00; H01L 21/76; H01L 21/425; H01L 21/26; H01L 21/42
(52) U.S. Cl. .................. 438/75; 438/76; 438/433; 438/524; 438/724
(58) Field of Search .................. 438/75, 76, 433, 438/524, 535, 546, 724, 798

(56) References Cited

U.S. PATENT DOCUMENTS

| | | | | |
|---|---|---|---|---|
| 4,466,174 A | * | 8/1984 | Darley et al. | 438/178 |
| 5,115,458 A | | 5/1992 | Burkey et al. | 377/58 |
| 5,130,774 A | | 7/1992 | Stevens et al. | 257/445 |
| 5,338,691 A | * | 8/1994 | Enomoto et al. | 438/57 |
| 5,939,767 A | * | 8/1999 | Brown et al. | 257/551 |
| 6,583,061 B2 | * | 6/2003 | Stevens | 438/700 |
| 6,624,495 B2 | * | 9/2003 | Schmidt | 257/509 |

* cited by examiner

Primary Examiner—William M. Brewster
(74) Attorney, Agent, or Firm—Peyton C. Watkins

(57) ABSTRACT

A method for creating a lateral overflow drain, anti-blooming structure in a charge-coupled device, the method includes the steps of providing a substrate of a first conductivity type; providing a layer of silicon dioxide on the substrate; providing a layer of silicon nitride on the silicon dioxide layer; providing a first masking layer on the silicon nitride layer and having an opening in the first masking layer of a dimension which substantially equals a dimension of a subsequently implanted channel stop of the first conductivity type; etching away the exposed silicon nitride within the opening in the first masking layer; implanting ions of the first conductivity type through the first masking layer and into the substrate for creating the channel stop and removing the first masking layer; growing the silicon dioxide layer so that the channel stop is spanned by a thickest field silicon dioxide layer in the etched away portion; patterning a second masking layer having an opening adjacent the channel stop with a dimension substantially equal to a dimension of a subsequently implanted lateral overflow drain of a second conductivity type; etching away the exposed silicon nitride within the opening in the second masking layer; implanting the second conductivity type for forming the lateral overflow drain and removing any remaining masking layer; and growing the silicon dioxide layer so that a thicker silicon dioxide forms spanning the lateral overflow drain and the thickest silicon dioxide layer forms spanning the channel stop.

10 Claims, 5 Drawing Sheets

METHOD FOR CREATING A LATERAL OVERFLOW DRAIN, ANTI-BLOOMING STRUCTURE IN A CHARGE COUPLED DEVICE

CROSS REFERENCE TO RELATED APPLICATIONS

The present application is related to U.S. Pat. No. 6,583,061 issued Jun. 24, 2003, entitled METHOD FOR CREATING AN ANTI-BLOOMING STRUCTURE IN A CHARGE COUPLED DEVICE, by Eric G. Stevens, and to U.S. Ser. No. 09/945,034, filed Aug. 31, 2001, entitled A LATERAL OVERFLOW DRAIN, ANTI-BLOOMING STRUCTURE FOR CCD DEVICES HAVING IMPROVED BREAKDOWN VOLTAGE, by Edmund K. Banghart and Eric G. Stevens.

FIELD OF THE INVENTION

The invention relates generally to the field of image sensors and, more particularly, to such image sensors having a lateral overflow drain substantially underneath a thick field dielectric.

BACKGROUND OF THE INVENTION

In full frame type, charge-coupled device (CCD) image sensors, lateral overflow drain (LOD) structures formed along the sides of the vertical CCD shift registers to provide means for conducting excess electrical charges away from the imaging area are well known in the art, (e.g., U.S. Pat. No. 5,130,774 issued Jul. 14, 2002). Such removal is necessary to prevent the image defect known as blooming in the CCD pixels, in which the column becomes either partially or completely flooded with charge thereby destroying the intended image. Referring to FIG. 1, an illustration of a conventional lateral overflow drain structure is shown in cross section drawn at the center of two adjacent columns. To form the LOD, an implant consisting of n-type impurities is made into the p-type substrate at the edge of the device active area and is typically positioned adjacent to a region of thick field oxidation that has been grown to provide electrical isolation between the vertical CCD columns of the imaging area and the LOD. Electrical isolation is also provided and enhanced by a p-type implant made under the field oxidation. Upon illumination of the array, photogenerated electrical charge is collected in the implanted n-type buried channel regions. To prevent blooming at high illumination levels, a region of the buried channel that connects the CCD to the LOD is compensated with p-type impurities to form an electrostatic potential barrier to the LOD. This barrier height is adjusted so that it is lower than the barriers to adjacent pixels. Thus, excess electrical charges, that would normally overfill the buried channel regions and bloom up and down the columns, instead find an outlet over the LOD barrier into the n-type LOD drain where they can be safely conducted away from the imaging area. A plot of the electrostatic potential, or channel potential, versus position for the structure under typical operational condition appears in FIG. 2.

In order to provide a sufficient level of conductivity to handle the large amounts of overflow current typically required for high-performance imaging applications, it is usually necessary to introduce a large dose of n-type impurities to form the LOD. However, it is found from numerical simulation of the device shown in FIG. 1, that a practical limitation on the amount of n-type impurities that can be implanted (and therefore an upper bound on the lateral overflow drain conductivity) is reached when the electrical fields produced at the silicon surface become high enough to cause electrical breakdown of the LOD via the impact ionization mechanism (also known as avalanche breakdown) or via quantum mechanical band-to-band tunneling. In simple terms, electrical breakdown results in the generation of undesirably large electric leakage currents. The breakdown condition ordinarily is produced as the applied bias on the device electrodes is increased. It should be evident to those skilled in the art that the conditions for avalanche breakdown are most severe for the accumulation mode of operation U.S. Pat. No. 5,115,458 issued May 19, 1992, where the gate electrodes are placed at, say, $-10$ volts. Because the lateral overflow drain is biased at, say, 10 volts, a total of 20 volts is placed across the thin gate dielectric, with the highest electric field occurring at the silicon surface above the center of the lateral overflow drain implant. A representative plot of the surface electric field strength versus position is included in FIG. 1.

To avoid this surface breakdown limitation, the drain can be placed underneath the thick field oxide that is typically used for channel-to-channel isolation between the vertical CCDs of these devices as described in U.S. patent Ser. No. 09/945,034, filed Aug. 31, 2001. By placing the field oxide layer over the lateral overflow drain (in place of the relatively thin gate dielectric), the surface electric field is reduced in inverse proportion to the thickness. In implementing such a device, the lateral overflow drain should be aligned to the edge of the field oxide layer. If the drain is not fully covered by the field oxide layer, its breakdown voltage will be reduced as limited by the portion of the drain that protrudes out beneath the thinner gate dielectric. If, on the other hand, the drain is placed too far laterally underneath the field oxide layer, connection to it via the buried channel may be lost. This latter problem could arise because the buried channel is typically self-aligned to the field oxide edge by implanting it after the field oxide growth. This may render the structure nonfunctional. Although the latter limitation could be eliminated by implanting the buried channel prior to the field oxide growth, the former problem would still exist.

Consequently, a need exists for overcoming the above-described shortcomings by providing a process wherein the lateral overflow drain is underneath and self aligned to one edge of a thick dielectric layer.

SUMMARY OF THE INVENTION

The present invention is directed towards overcoming one or more of the problems set forth above. Briefly summarized, according to one aspect of the present invention, the invention resides in a method for creating a self aligned, under-the-field-oxide lateral overflow drain, anti-blooming structure in a charge-coupled device, the method comprising the steps of (a) providing a substrate of a first conductivity type; (b) providing a layer of silicon dioxide on the substrate; (c) providing a layer of silicon nitride on the silicon dioxide layer; (d) providing a first masking layer on the silicon nitride layer and having an opening in the first masking layer of a dimension which substantially equals a dimension of a subsequently implanted channel stop of the first conductivity type; (e) etching away the exposed silicon nitride within the opening in the first masking layer; (f) implanting ions of the first conductivity type through the first masking layer and into the substrate for creating the channel stop and removing the first masking layer; (g) growing the silicon dioxide layer so that the channel stop is spanned by a thickest field silicon dioxide layer in the etched away portion; (h) patterning a second masking layer having an opening adjacent the channel stop with a dimension substantially equal to a dimension of a subsequently implanted lateral overflow drain of a second conductivity type; (i) etching away the exposed silicon nitride within the opening in the second masking layer; (j) implanting the second conductivity type for forming the lateral overflow drain and removing any remaining masking layer; and (k) growing the silicon dioxide layer so that a thicker silicon dioxide forms spanning the lateral overflow drain and the thickest silicon dioxide layer forms spanning the channel stop.

An alternative embodiment of the present invention eliminates the step of growing the first thickest field silicon dioxide layer in (g) above by using the etched away portion of the silicon nitride layer as a mark to which a subsequent lateral overflow drain region can be aligned to, and by growing a thick silicon dioxide layer spanning both the lateral overflow drain and the channel stop at the same time in (k). This simpler, alternative embodiment can be used provided that the mask alignment tool is capable of recognizing alignment marks formed by etched away portions of the silicon nitride layer, only.

These and other aspects, objects, features and advantages of the present invention will be more clearly understood and appreciated from a review of the following detailed description of the preferred embodiments and appended claims, and by reference to the accompanying drawings.

Advantageous Effect of the Invention

The present invention has the following advantages of providing self-alignment of one side of the lateral overflow drain to the edge of a thick field silicon dioxide. Still further, the thick field silicon dioxide increases the surface breakdown of the lateral overflow drain such that the bulk breakdown can be a limiting component. The bulk breakdown depends primarily on the dopant level of the channel stop region, which is higher than the surface breakdown limit in this case. Finally, the process of the present invention uses resist mask processes to define the channel stop implant, lateral overflow drain implant, and the thick field regions, which are simpler than hard mask processes.

DETAILED DESCRIPTION OF THE INVENTION

Figure 1:
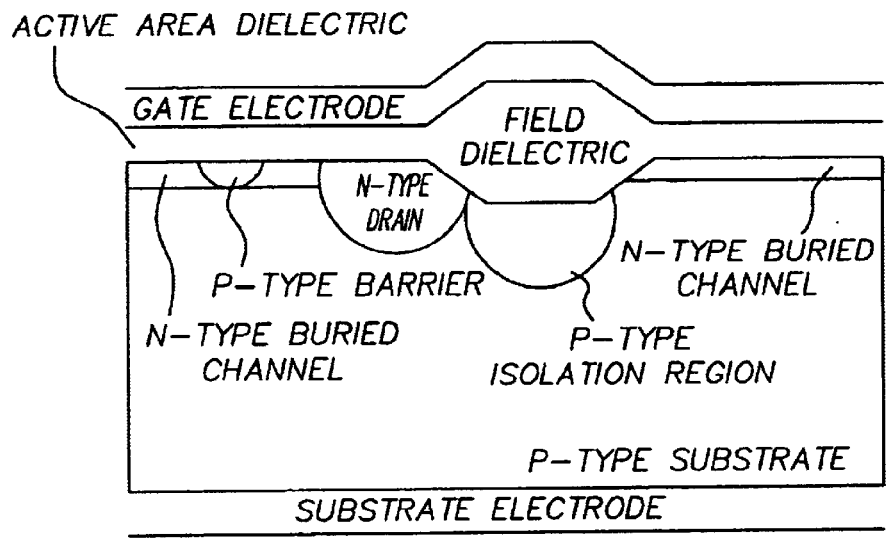
FIG. 1 is a view in vertical cross section of a prior art charge coupled device and its anti-blooming structure along with a plot of the surface electric field.
Figure 2:
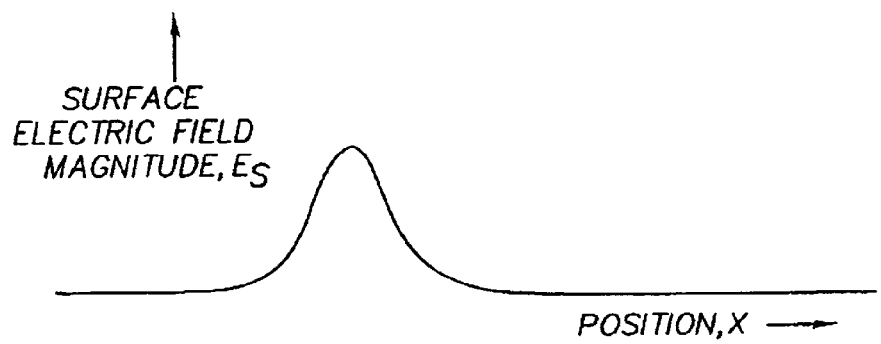
FIG. 2 is a plot of the electrostatic potential maximum versus position in the prior art CCD and anti-blooming structure of FIG. 1.
Figure 3:
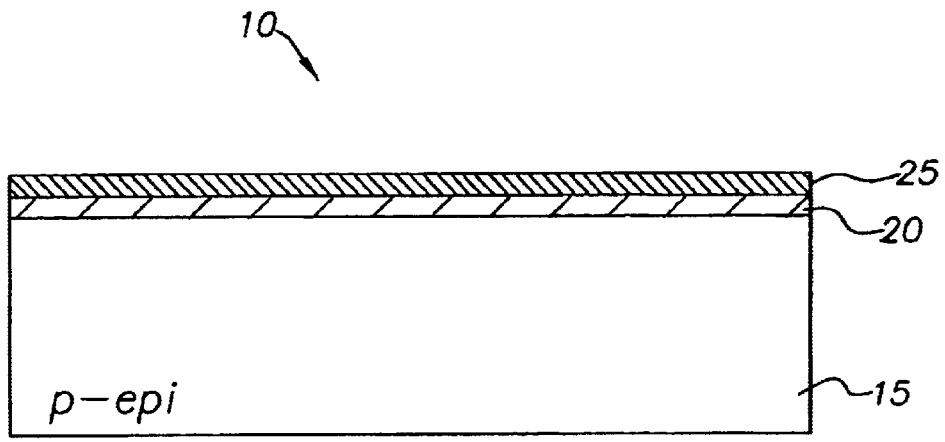
FIG. 3 is a view in cross section of an initial stage in the process of creating an image sensor of the present invention.

Referring to FIG. 3, there is shown the initial phase of creating a full-frame image sensor 10 of the present invention. The image sensor 10 includes a substrate 15 having a layer of silicon dioxide 20 grown or deposited thereon, and a layer of silicon nitride 25 is then deposited on the silicon dioxide 20.

Figure 4:
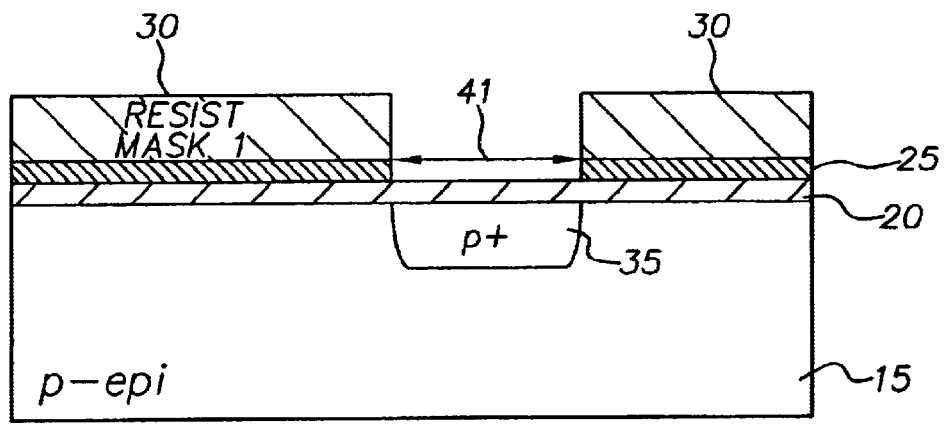
FIG. 4 is a view in cross section of a subsequent stage of FIG. 3.

Referring to FIG. 4, a layer of resist 30 is placed over the silicon nitride 25, and an opening in the resist 30 and an opening 41 in the silicon nitride layer 25 are created through which a $P^+$ channel stop region 35 is implanted. Alternatively, in lieu of creating openings in both the resist 30 and silicon nitride 25 and then implanting the channel stop region the order of the last two steps can be reversed. The opening in the resist 30 may be created, followed by the channel stop region implant, after which the silicon nitride 25 is etched.

Figure 5:
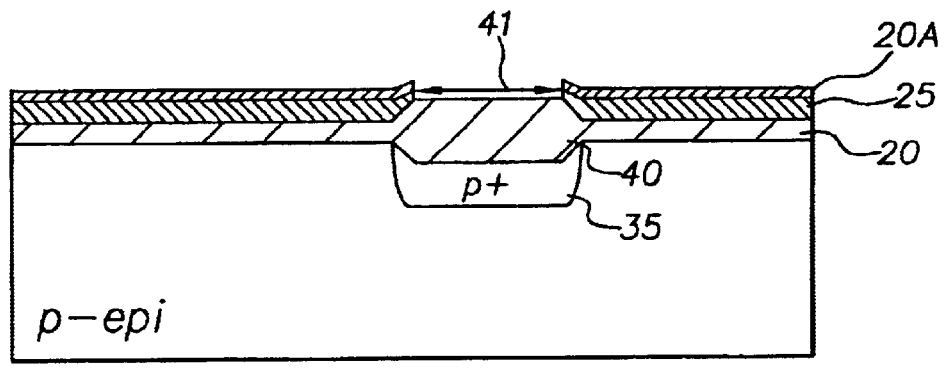
FIG. 5 is a view in cross section of a subsequent stage of FIG. 4.

Referring to FIG. 5, the resist 30 (see FIG. 4) is removed and a thickest portion of silicon dioxide 40 is grown in the opening 41. A second layer of oxynitride 20a is also grown atop the silicon nitride 25 simultaneously during this oxidation step.

Figure 6:
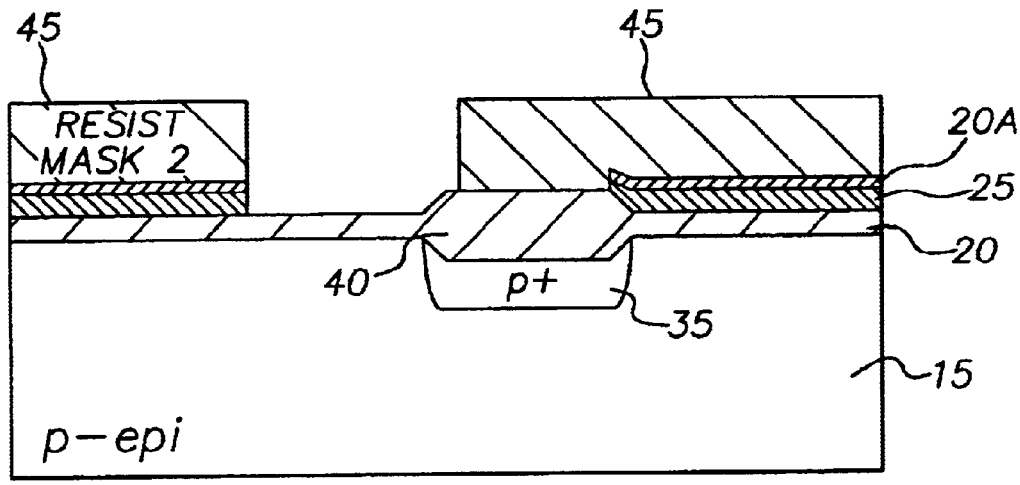
FIG. 6 is a view in cross section of a subsequent stage of FIG. 5.
Figure 7:
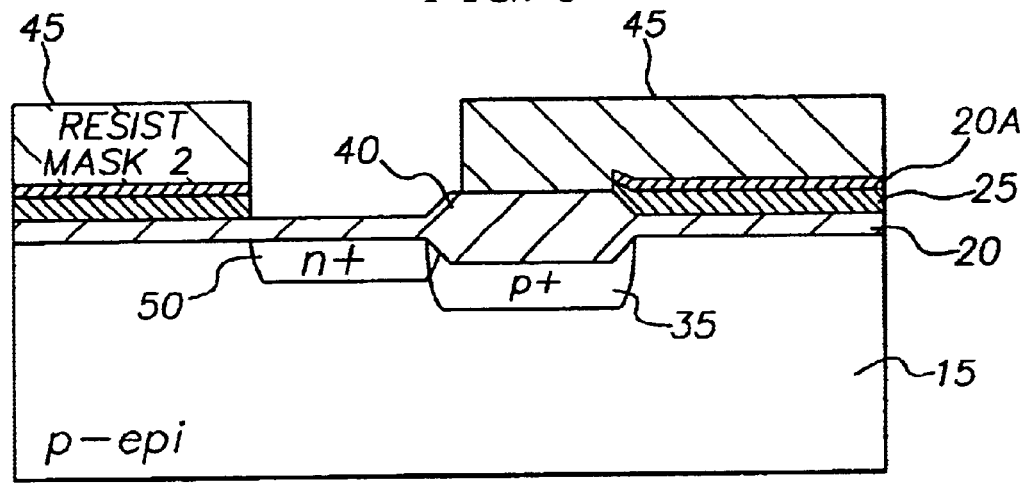
FIG. 7 is a view in cross section of a subsequent stage of FIG. 6.
Figure 8:
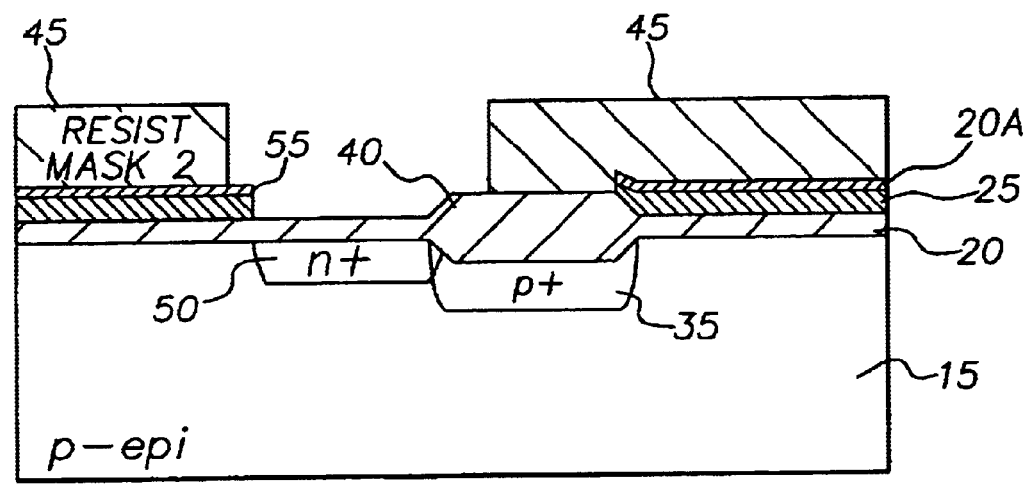
FIG. 8 is an alternative embodiment of FIG. 7.
Figure 9:
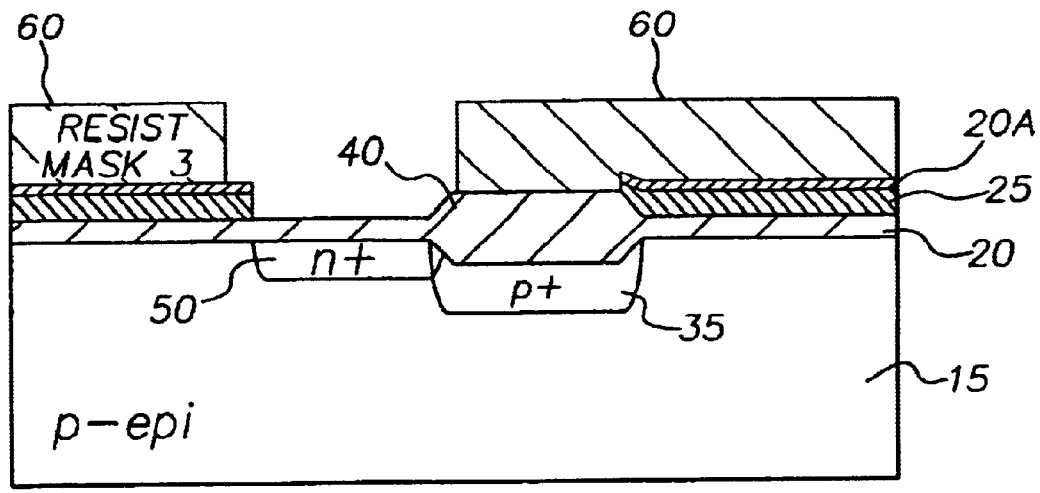
FIG. 9 is another alternative embodiment of FIG. 7.

Referring to FIG. 6, another layer of resist 45 which is aligned to the thickest silicon dioxide layer 40 previously grown as shown in FIG. 5 is deposited and patterned over a subsequently implanted lateral overflow drain region. The oxynitride 20a, silicon dioxide 20 and silicon nitride 25 are then etched for forming another opening. Referring to FIG. 7, an $n^+$ implant 50 is implanted through the opening into the substrate 15 for forming the lateral overflow drain. It should be noted that as before, the order of the steps of etching and then implanting as shown in FIGS. 6 and 7, could be reversed if so desired. Alternatively, and referring to FIG. 8, it is instructive to note that if the lateral overflow drain needs to be extended beyond the silicon nitride edge 55 to ensure connection between the CCD buried channel and the subsequently implanted lateral overflow drain region, that the resist 45 can be eroded away to the desired position as shown and the $n^+$ implant 50 is implanted therein. Another alternative to ensure connection between the CCD buried channel and the subsequently implanted lateral overflow drain region is illustrated in FIG. 9. In this non-preferred embodiment, the second layer of resist 45 (see FIGS. 7 and 8) is removed, and a third layer of resist 60 is patterned in the desired position and the lateral overflow drain is implanted into the substrate 15.

Figure 10:
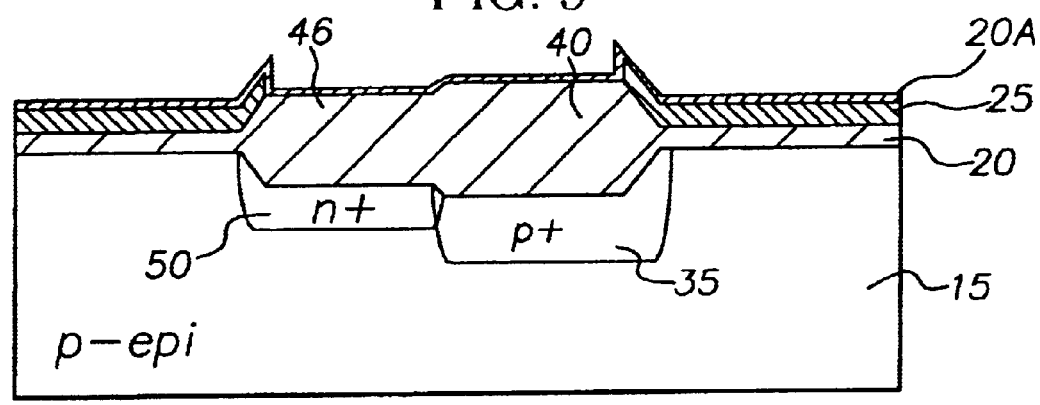
FIG. 10 is a view in cross section of a subsequent stage of FIGS. 7, 8 and 9.
Figure 11:
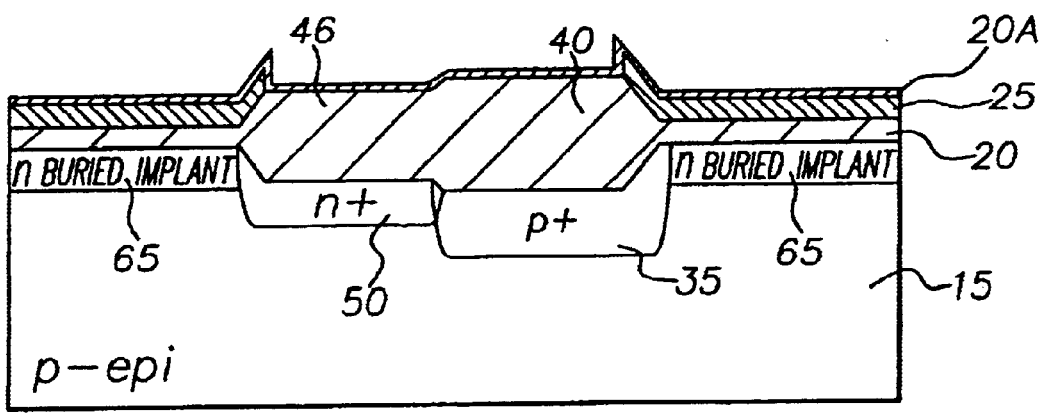
FIG. 11 is a view in cross section of a subsequent stage of FIG. 10.

Referring to FIG. 10, after the mask (either 45 or 60) is removed, a thicker silicon dioxide portion 46 is grown again such that the thicker silicon dioxide field 46 spanning the $n^+$ implant 50 is at the desired thickness. Referring to FIG. 11, the buried channel 65 is implanted for forming the charge-coupled device (CCD), and the oxynitride-silicon nitride-silicon dioxide stack 20a-25-20 may be used as the gate dielectric for the CCD.

Figure 12:
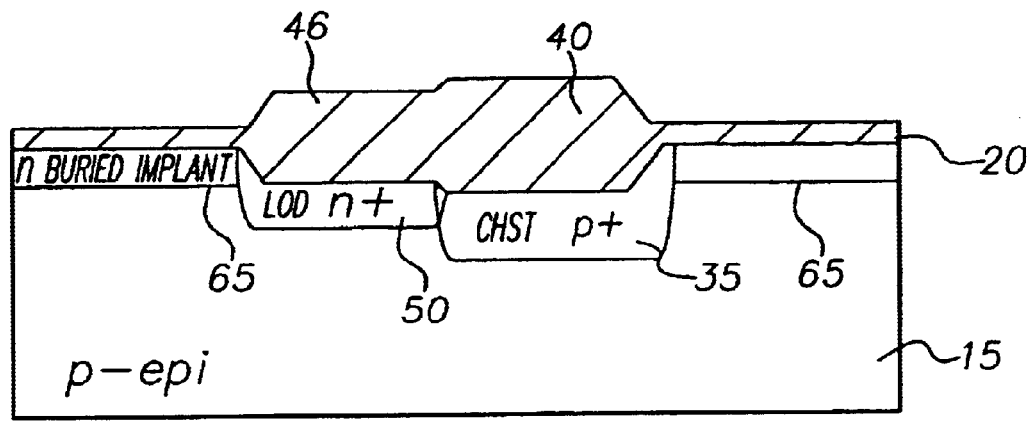
FIG. 12 is a view in cross section of a subsequent stage of FIG. 11.

Referring to FIG. 12, alternatively, where only the silicon dioxide 20 is needed as the gate dielectric 20, the CCD buried channel implant 65 may be formed by removing the oxynitride-silicon nitride stack 20a-25, and a sacrificial silicon dioxide layer (not shown) is grown or deposited and the CCD buried channel 65 implanted. The sacrificial layer is then removed, and the gate silicon dioxide layer 20 is used as the gate dielectric. Alternatively, the buried channel could be implanted through the gate silicon dioxide layer 20 after it is grown, thereby eliminating the need for the sacrificial silicon dioxide layer.

Figure 13:
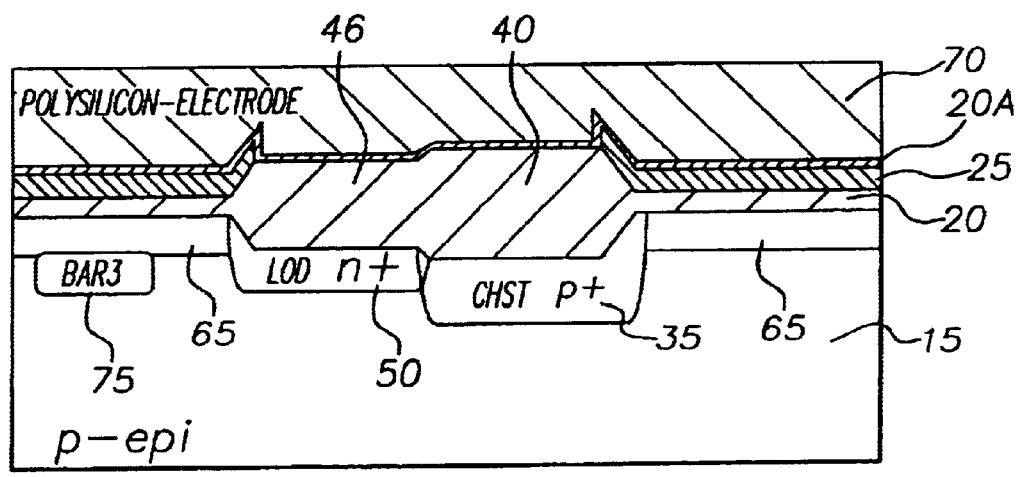
FIG. 13 is a view in cross section of a subsequent stage of FIG. 12.

Finally, referring to FIG. 13, a polysilicon or other suitable transparent or semitransparent film 70 is deposited over the gate dielectric 20a-25-20 (or alternatively 20 in the embodiment of FIG. 13) and the barrier region 75 is implanted to form the antiblooming barrier or channel region. Note, this barrier region may be implanted prior to the polysilicon deposition.

An alternative embodiment of the present invention could be constructed with all the steps the same as above except as noted in this paragraph. Referring to FIGS. 4 and 5, the alternative embodiment eliminates the step of growing the first thickest silicon dioxide layer 40 of FIG. 5 by using the etched away portion 41 of the silicon nitride layer 25 as a mark to which a subsequent lateral overflow drain region can be aligned. Then, skipping ahead to FIG. 10, a thick silicon dioxide layer of substantially uniform thickness is grown spanning both the lateral overflow drain 50 and the channel stop 35 at the same time and after the lateral overflow drain 50 has been implanted. This simpler, alternative embodiment can be used provided that the mask alignment tool is capable of recognizing alignment marks formed by etched away portions of the silicon nitride layer, only.

The invention has been described with reference to a preferred embodiment. However, it will be appreciated that variations and modifications can be effected by a person of ordinary skill in the art without departing from the scope of the invention.

PARTS LIST 10 image sensor
15 substrate
20 silicon dioxide/gate dielectric layer
20a oxynitride
25 silicon nitride
30 resist
35 P+ channel stop region
40 thickest portion of silicon dioxide
41 opening
45 resist
46 thicker silicon dioxide portion
50 n+ implant/lateral overflow drain
55 silicon nitride edge
60 resist
65 buried channel
70 polysilicon or other suitable transparent or semitransparent film
75 barrier region

What is claimed is:

1. A method for creating a lateral overflow drain, antiblooming structure in a charge coupled device, the method comprising the steps of:
   (a) providing a substrate of a first conductivity type;
   (b) providing a layer of silicon dioxide on the substrate;
   (c) providing a layer of silicon nitride on the silicon dioxide layer;
   (d) providing a first masking layer on the silicon nitride layer and having an opening in the first masking layer of a dimension which substantially equals a dimension of a subsequently implanted channel stop of the first conductivity type;
   (e) etching away the exposed silicon nitride within the opening in the first masking layer;
   (f) implanting ions of the first conductivity type through the first masking layer and into the substrate for creating the channel stop and removing the first masking layer;
   (g) growing the silicon dioxide layer so that the channel stop is spanned by a thickest field silicon dioxide layer in the etched away portion;
   (h) patterning a second masking layer having an opening adjacent the channel stop with a dimension substantially equal to a dimension of a subsequently implanted lateral overflow drain of a second conductivity type;
   (i) etching away the exposed silicon nitride within the opening in the second masking layer;
   (j) implanting the second conductivity type for forming the lateral overflow drain and removing any remaining masking layer; and
   (k) growing the silicon dioxide layer so that a thicker silicon dioxide forms spanning the lateral overflow drain and the thickest silicon dioxide layer forms spanning the channel stop.

2. The method as in claim 1 further comprising the step of providing p type as the first conductivity type.

3. The method as in claim 1 further comprising the step of providing a buried channel of the second conductivity type within the substrate between the channel stops.

4. The method as in claim 1 further comprising the steps of removing the second masking layer immediately after step (i), providing a third masking layer, which third masking layer is patterned having an opening with a dimension substantially equal to a dimension of the lateral overflow drain, which is larger than the etched away portion of the silicon nitride in step (i) and continuing with step (j).

5. The method as in claim 1 further comprising the step of providing by eroding the second masking layer to an opening with a dimension substantially equal to a dimension of the lateral overflow drain after step (i) and before step (j).

6. A method for creating a lateral overflow drain, antiblooming structure in a charge coupled device, the method comprising the steps of:
   (a) providing a substrate of a first conductivity type;
   (b) providing a layer of silicon dioxide on the substrate;
   (c) providing a layer of silicon nitride on the silicon dioxide layer;
   (d) providing a first masking layer on the silicon nitride layer and having an opening in the first masking layer of a dimension which substantially equals a dimension of a subsequently implanted channel stop of the first conductivity type;
   (e) etching away the exposed silicon nitride within the opening in the first masking layer;
   (f) implanting ions of the first conductivity type through the first masking layer and into the substrate for creating the channel stop and removing the first masking layer;
   (g) patterning a second masking layer having an opening adjacent the channel stop with a dimension substantially equal to a dimension of a subsequently implanted lateral overflow drain of a second conductivity type;
   (h) etching away the exposed silicon nitride within the opening in the second masking layer;
   (i) implanting the second conductivity type for forming the lateral overflow drain and removing any remaining masking layer; and (j) growing the silicon dioxide layer so that a thick silicon dioxide forms spanning the lateral overflow drain and the channel stop.

7. The method as in claim 6 further comprising the step of providing p type as the first conductivity type.

8. The method as in claim 6 further comprising the step of providing a buried channel of the second conductivity type within the substrate between the channel stops.

9. The method as in claim 6 further comprising the steps of removing the second masking layer immediately after step (h), providing a third masking layer, which third masking layer is patterned having an opening with a dimension substantially equal to a dimension of the lateral overflow drain, which is larger than the etched away portion of the silicon nitride in step (h) and continuing with step (i).

10. The method as in claim 6 further comprising the step of providing by eroding the second masking layer to an opening with a dimension substantially equal to a dimension of the lateral overflow drain after step (h) and before step (i).

* * * * *